（12）United States Patent
Sakai et al.

(10) Patent No.: US 9,299,410 B2
(45) Date of Patent: Mar. 29, 2016

(54) READING MAGNETIC MEMORY BASED ON REGIONS WITHIN A CELL ARRAY

(71) Applicants: Shintaro Sakai, Seoul (KR); Masahiko Nakayama, Seoul (KR)

(72) Inventors: Shintaro Sakai, Seoul (KR); Masahiko Nakayama, Seoul (KR)

( * ) Notice: Subject to any disclaimer, the term of this patent is extended or adjusted under 35 U.S.C. 154(b) by 14 days.

(21) Appl. No.: 14/201,613

(22) Filed: Mar. 7, 2014

(65) Prior Publication Data

US 2015/0063014 A1  Mar. 5, 2015

Related U.S. Application Data

(60) Provisional application No. 61/873,798, filed on Sep. 4, 2013.

(51) Int. Cl.
*G11C 11/16* (2006.01)

(52) U.S. Cl.
CPC .......... *G11C 11/1673* (2013.01); *G11C 11/161* (2013.01)

(58) Field of Classification Search
CPC ........ G11C 7/14; G11C 7/06; G11C 11/1673; G11C 11/1659; G11C 11/1653; G11C 11/165; G11C 11/16; G11C 11/02; G11C 11/161
See application file for complete search history.

(56) References Cited

U.S. PATENT DOCUMENTS

| 8,867,267 B2 * | 10/2014 | Mouli ........................... 365/175 |
| 8,923,040 B2 * | 12/2014 | Lin et al. ...................... 365/158 |
| 2004/0140522 A1 | 7/2004 | Yoshhara et al. |
| 2005/0122769 A1 | 6/2005 | Miyatake et al. |
| 2007/0159870 A1 * | 7/2007 | Tanizaki et al. ............... 365/148 |
| 2008/0120526 A1 * | 5/2008 | Eguchi et al. ................. 714/773 |
| 2008/0308887 A1 | 12/2008 | Asao et al. |
| 2009/0135641 A1 * | 5/2009 | Tajiri et al. .................... 365/148 |
| 2009/0273961 A1 * | 11/2009 | Ono et al. ....................... 365/51 |
| 2010/0232210 A1 | 9/2010 | Kajiyama et al. |
| 2012/0147664 A1 | 6/2012 | Rho |
| 2012/0199895 A1 | 8/2012 | Nitta |
| 2012/0314477 A1 * | 12/2012 | Siau .............................. 365/148 |

OTHER PUBLICATIONS

International Search Report including Written Opinion dated Sep. 22, 2014, issued in parent International Application No. PCT/JP2014/071350.

* cited by examiner

Primary Examiner — J. H. Hur
(74) Attorney, Agent, or Firm — Holtz, Holtz & Volek PC

(57) ABSTRACT

According to one embodiment, a magnetic memory includes a cell array includes a plurality of memory cells, each memory cell including a magnetoresistive effect element; and a read circuit to read data from a memory cell selected based on an address signal from among the memory cells. The read circuit selects one determination level from among a plurality of determination levels corresponding to a position of a magnetoresistive effect element in the cell array and uses the selected determination level to perform reading of the data.

20 Claims, 9 Drawing Sheets

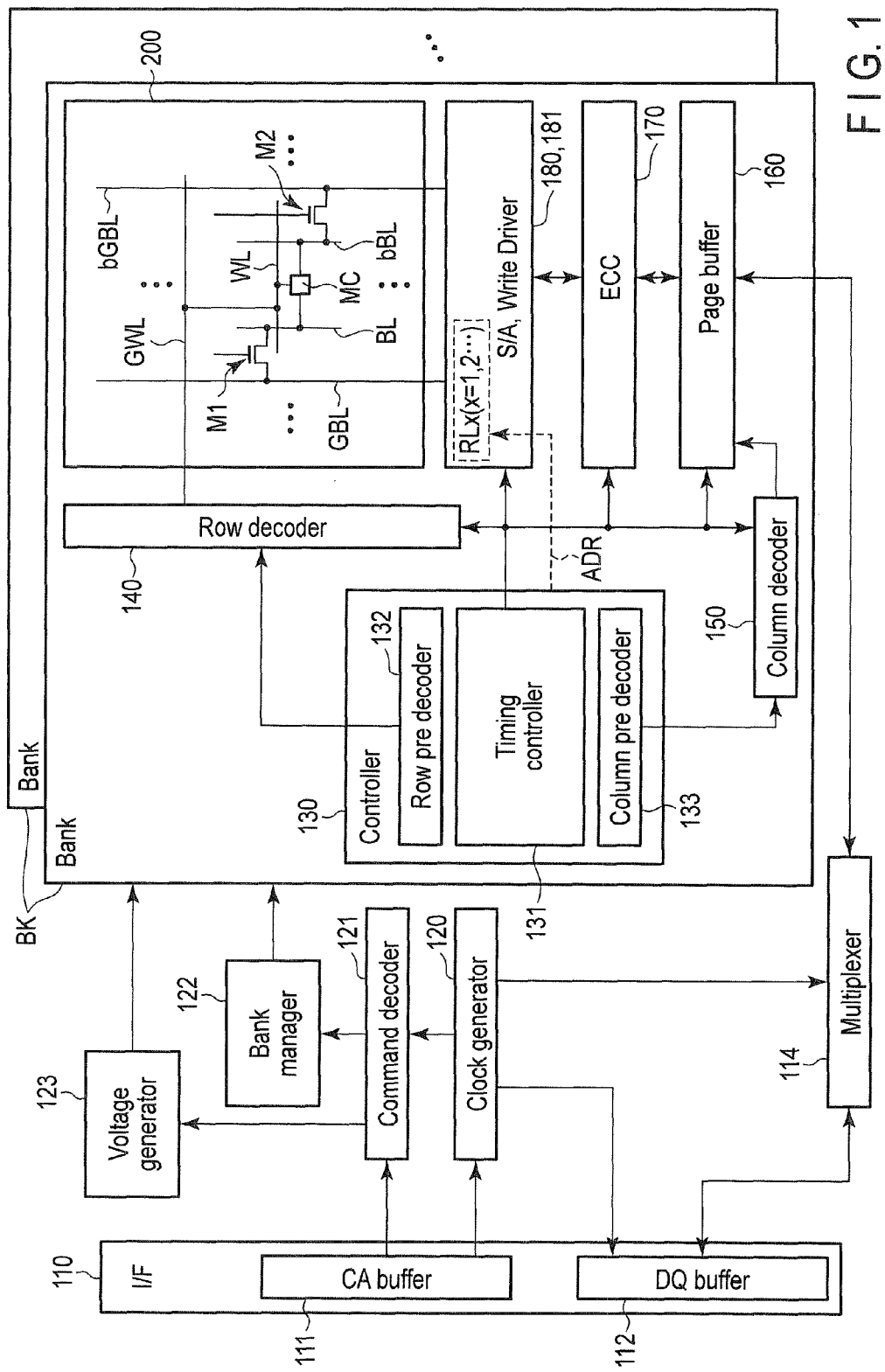
F I G. 1

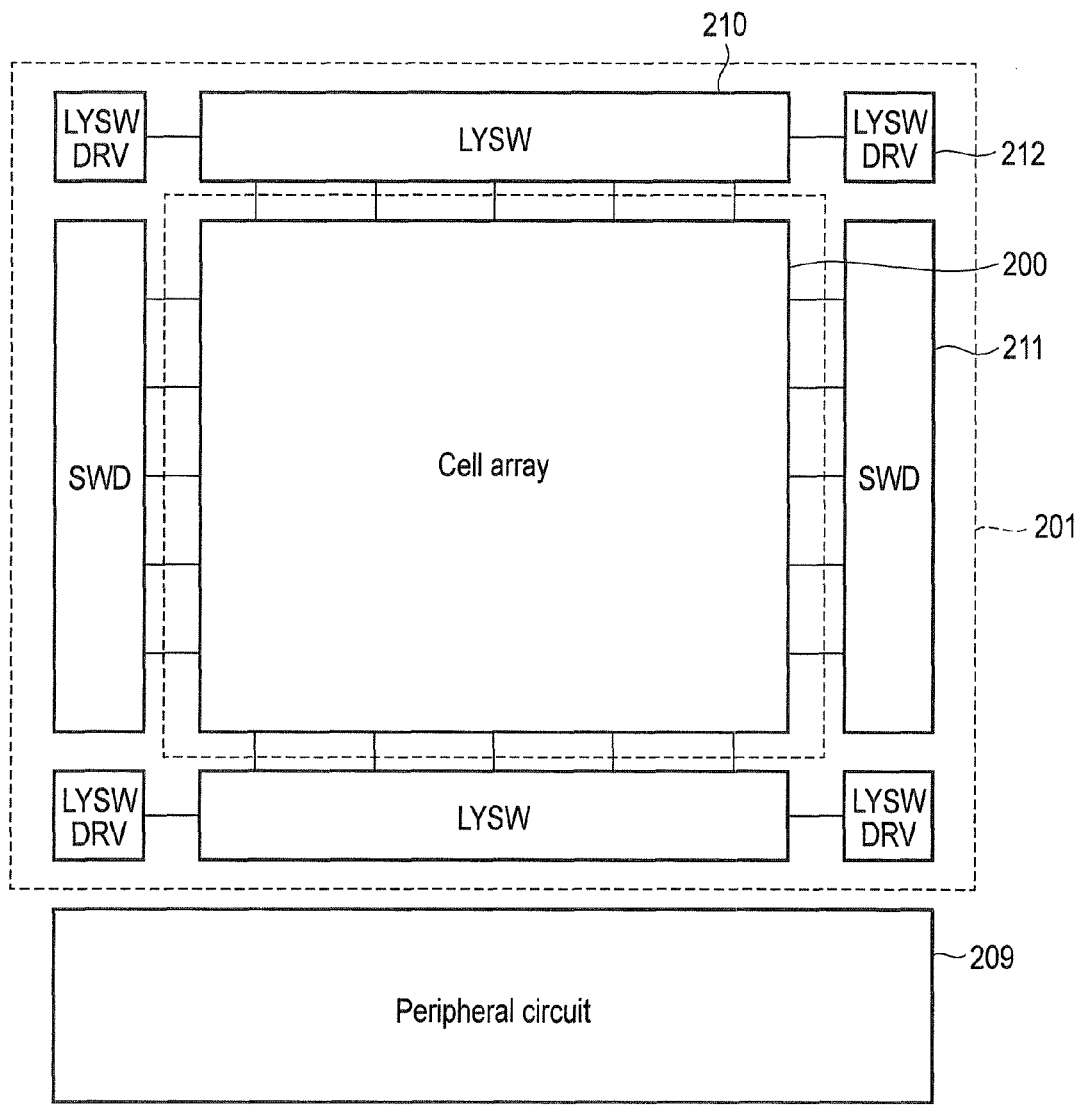
F I G. 2

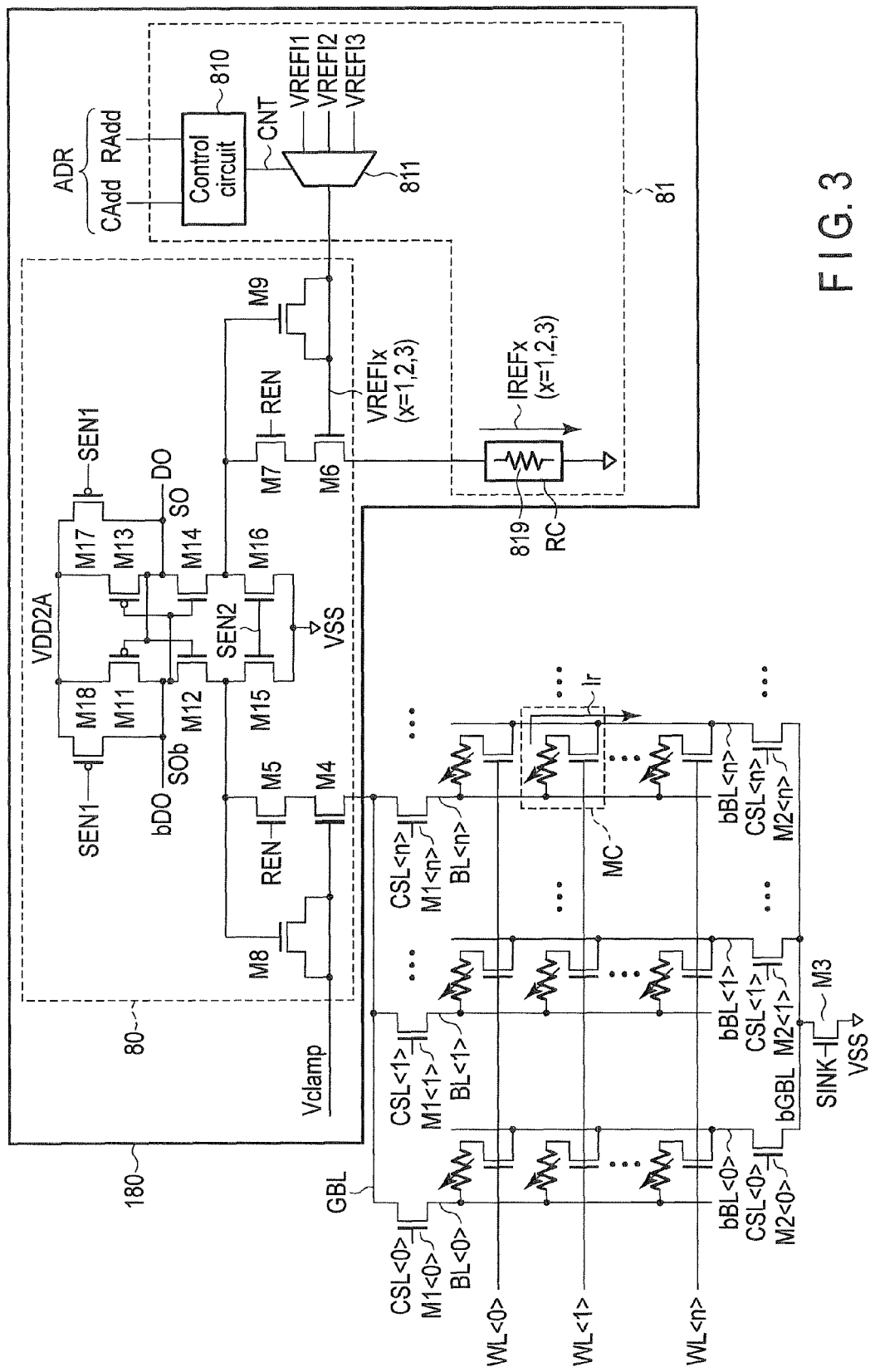
F I G. 3

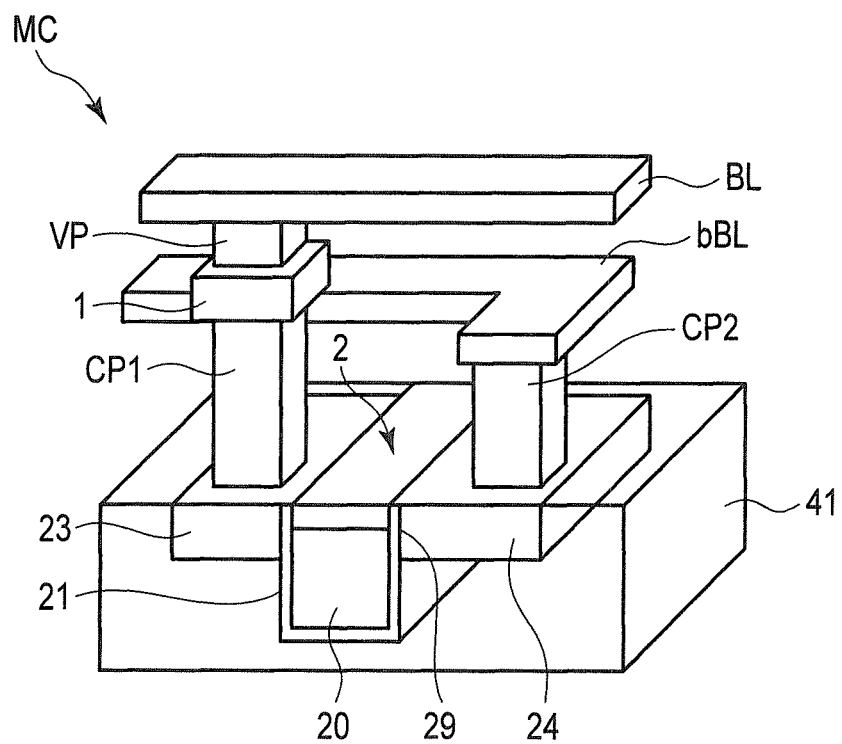
F I G. 4

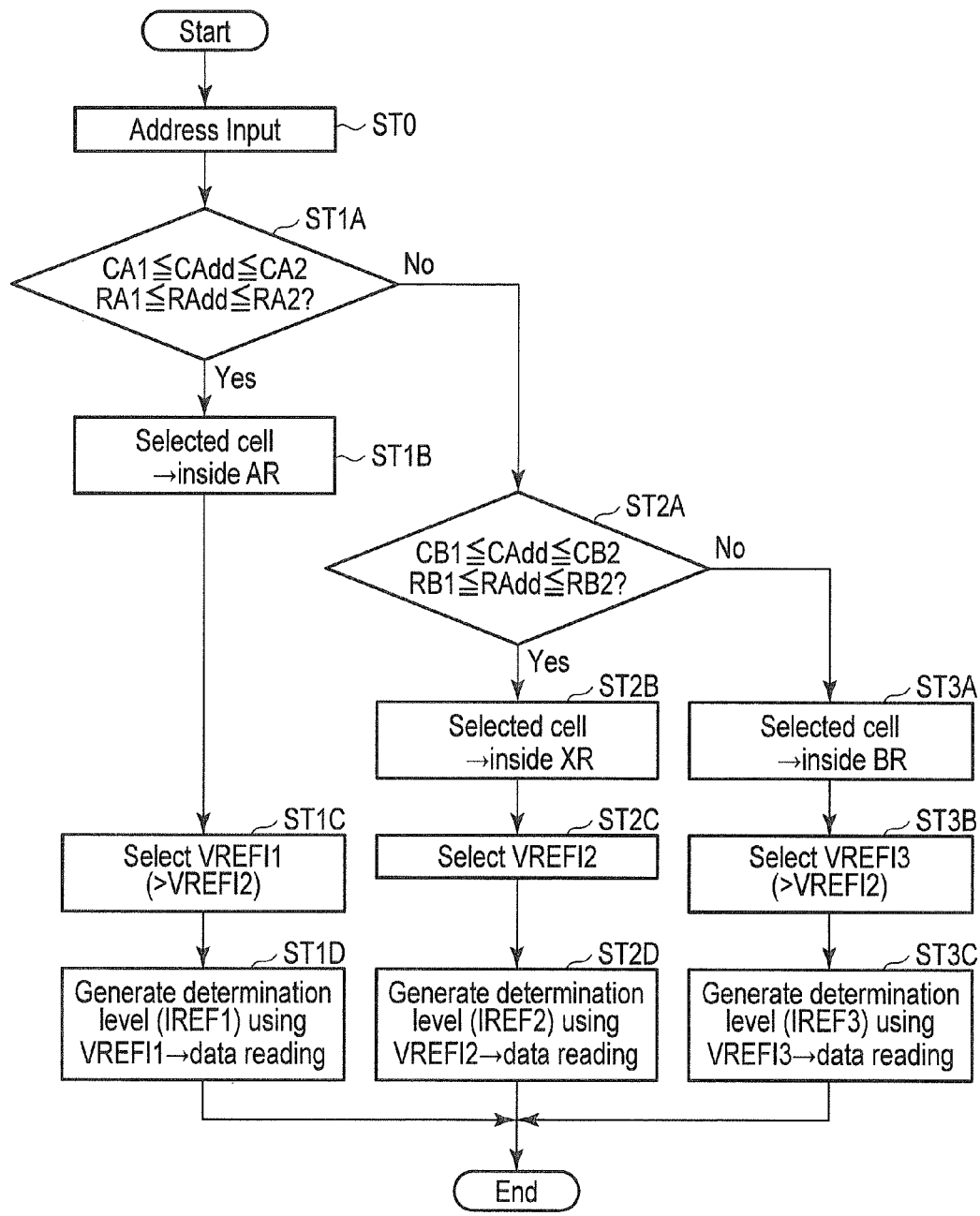
F I G. 10

READING MAGNETIC MEMORY BASED ON REGIONS WITHIN A CELL ARRAY

CROSS-REFERENCE TO RELATED APPLICATIONS

This application claims the benefit of U.S. Provisional Application No. 61/873,798, filed Sep. 4, 2013, the entire contents of which are incorporated herein by reference.

FIELD

Embodiments described herein relate generally to a magnetic memory and a controlling method of the magnetic memory.

BACKGROUND

In recent years, a spin transfer torque type Magnetoresistive Random Access Memory (STT-MRAM) is proposed as a semiconductor memory. An MRAM contains a magnetoresistive effect element in a memory cell. A magnetoresistive effect element includes two magnetic layers (ferromagnetic layers) and a nonmagnetic layer provided therebetween. Data of "1" or "0" is stored in a memory cell depending on a magnetized state of the two magnetic layers of the magnetoresistive effect element, that is, whether spin orientations of the two magnetic layers are parallel or antiparallel.

BRIEF DESCRIPTION OF THE DRAWINGS

FIG. 1 is a block diagram showing an overall configuration example of a magnetic memory;

FIG. 2 is a view showing a configuration example near a cell array of the magnetic memory;

FIG. 3 is a schematic diagram showing a configuration example of the magnetic memory in an embodiment;

FIG. 4 is a view showing a structure example of a memory cell of the magnetic memory;

FIG. 10 is a diagram to describe an operation example of the magnetic memory in an embodiment.

DETAILED DESCRIPTION

Figure 5:
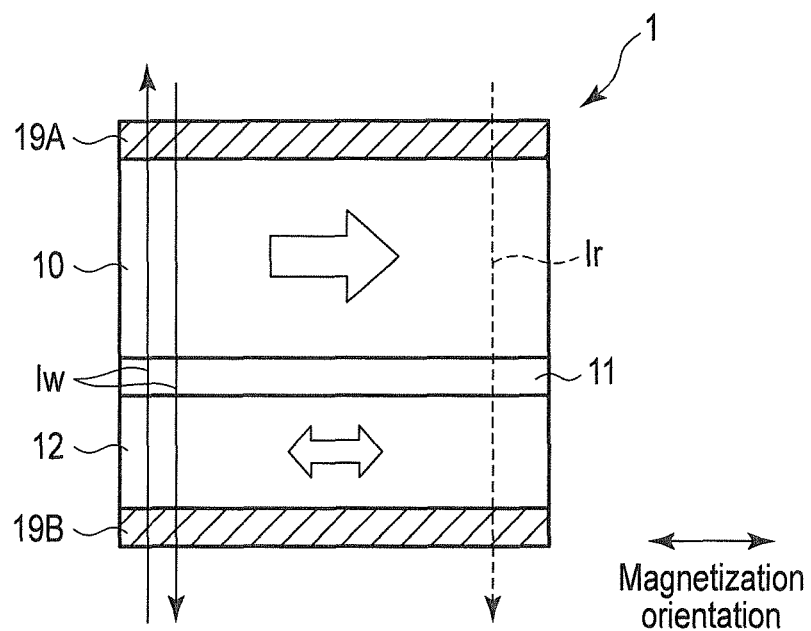
FIG. 5 is a schematic view showing a structure example of a magnetoresistive effect element.

The present embodiment will be described in detail below with reference to the drawings. In the description that follows, the same reference numerals are attached to elements having the same function and configuration and a duplicate description will be provided when necessary.

In general, according to one embodiment, a magnetic memory includes a cell array containing a plurality of memory cells arranged along first and second directions, each memory cell including a magnetoresistive effect element as a memory element; and a read circuit to read data from a memory cell selected based on an address signal from among the plurality of memory cells. The read circuit selects one determination level from a plurality of determination levels corresponding to a position of a magnetoresistive effect element in the cell array and uses the selected determination level to perform reading of the data from the selected memory cell.

Embodiment

The configuration and operation of a magnetic memory in an embodiment will be described with reference to FIGS. 1 to 11.

(1) Configuration

The configuration of a magnetic memory in an embodiment will be described with reference to FIGS. 1 to 9.

FIG. 1 is a block diagram showing an example of an overall configuration example of a magnetic memory in an embodiment.

As shown in FIG. 1, the magnetic memory in an embodiment includes a cell array 200 and a plurality of circuits to control the operation of the cell array.

In the magnetic memory, a magnetoresistive effect element is used as a memory element in the cell array 200. The magnetic memory in the present embodiment is, for example, a Magnetoresistive Random Access Memory (MRAM).

An MRAM in an embodiment includes an interface circuit 110 for transmission/reception of data between the MRAM (for example, an MRAM package) and an external device (for example, a memory controller or host device) and transmission/reception of a control signal (command/status). A CA buffer 111 and a DQ buffer 112 are provided inside the interface circuit 110.

The CA buffer 111 receives a command/address signal, a clock enable signal, a bank select signal, an external clock signal and the like from an external device. The DQ buffer 112 transmits or receives a data input/output signal (data), a data strobe signal, and a data mask signal.

A clock generator 120 generates an internal clock of the MRAM based on a signal from the CA buffer 111 based on a clock enable signal. The generated internal clock is supplied to predetermined circuits in the MRAM such as a command decoder 121, a multiplexer 114, and the DQ buffer 112. Each circuit in the MRAM operates at an operation timing based on the internal clock generated by the clock generator 120.

The command decoder 121 decodes a command based on a command/address signal transferred from the CA buffer 111. The decoded command is transmitted to a bank manager 122 and a voltage generator 123.

To perform an operation corresponding to a command/address signal, the bank manager 122 transfers various kinds of information such as addresses in the cell array 200 and control signals to each circuit in a bank BK to the bank BK selected by a bank select signal.

The voltage generator 123 generates various voltages used for an operation corresponding to a command and supplies the generated voltages to predetermined circuits in the bank BK.

For example, a plurality of banks BK are provided in the MRAM.

The cell array 200 is provided in the bank BK. Global bit lines GBL, bGBL, bit lines BL, bBL, a global word line GWL, and a word line WL are provided in the cell array. A plurality of memory cells MC are provided in the cell array 200 so as to be connected to wires GBL, bGBL, BL, bBL, GWL, WL.

A controller 130 is provided in the bank BK. The controller 130 controls the operation of each circuit in the bank BK. The controller 130 includes a timing controller 131, a row predecoder 132, a column pre-decoder 133 and the like.

The timing controller 131 controls the operation timing of each circuit 140, 150, 160, 170, 180 in the bank BK.

The row pre-decoder 132 performs, for example, pre-decoding for a row address of an address signal from the bank manager 122. The column pre-decoder 133 performs, for example, pre-decoding for a column address of an address signal from the bank manager 122.

The row decoder 140 decodes a row address from the row pre-decoder 132. The row decoder 140 controls activation of the global word line GWL and the word line (also called a sub-word line) WL in the cell array 200 based on the decoded row address.

The column decoder 150 decodes a column address from the column pre-decoder 133. The column decoder 150 controls activation of the global bit lines GBL, bGBL and the bit lines (also called sub-bit lines) BL, bBL in the cell array 200 based on the decoded column address.

The memory cell MC in the cell array 200 is made to be in an accessed state by the row decoder 140 and the column decoder 150.

The read circuit (sense amplifier) 180 and a write circuit (write driver) 181 are driven when data is read/written from/into the cell array 200 respectively.

The read circuit 180 is driven for reading data under the control of the controller 130. The read circuit 180 supplies a read current (or a read voltage) to the memory cell MC in the cell array 200 selected based on an address signal via the global bit lines GBL, bGBL and the bit lines BL, bBL. The read circuit 180 reads data stored in the memory cell MC by detecting a current value of the read current or a potential of the bit line.

The write circuit 181 is driven for writing data under the control of the controller 130. The write circuit 181 supplies a write current to the memory cell in the cell array 200 selected based on an address via the global bit lines GBL, bGBL and the bit lines BL, bBL.

For example, when data of an MRAM is written by a writing method based on spin-transfer torque (STT), a write current flows through a magnetoresistive effect element in the memory cell. In an STT-MRAM, the direction in which the write current flowing through the magnetoresistive effect element is controlled in accordance with data (for example, "0" or "1") to be written into the memory cell.

The error checking and correcting (ECC) circuit 170 performs ECC processing on data to be written into the cell array 200 and data read from the cell array 200.

The page buffer 160 temporarily stores data to be written into the cell array 200 and data read from the cell array 200 in units of data called "pages".

The multiplexer 114 adjusts the transfer timing of data between the bank BK and the buffer 112 (or between the MRAM and an external device) in a timing based on the internal clock.

FIG. 2 is a view showing an example of a circuit layout near a cell array of an MRAM.

As shown in FIG. 2, the MRAM has a core circuit 201 and a peripheral circuit 209 provided near the cell array 200.

In the cell array 200, a plurality of memory cells are arranged in a matrix shape. Data is stored in each memory cell.

The core circuit 201 is electrically connected to the cell array 200. Data is input and output between the core circuit 201 and the cell array 200. The core circuit 201 includes a local column switch circuit (LYSW) 210, a sub-word line decoder (SWD) 211, and a local column switch driver (LYSWDRV) 212.

The local column switch circuit 210 selectively connects the bit lines BL and bBL, and the global bit lines in accordance with a column address in a magnetic memory using a hierarchical bit line system. The sub-word line decoder 211 activates a word line and selectively connects the word line and a global word line in accordance with a row address. The local column switch driver 212 controls on/off of local column switches (for example, transistors M1, M2 in FIG. 1) in the local column switch circuit 210.

For example, the local column switch circuit 210 includes a transistor having an embedded gate electrode, the sub-word line decoder 211 includes a transistor having a planar gate electrode, and the local column switch driver 212 includes both of embedded and planar transistors.

The peripheral circuit (a peripheral circuit group, a peripheral circuit region) 209 is electrically connected to the cell array 200 via the core circuit 201. The peripheral circuit 209 includes, for example, a control circuit that controls the core circuit 201 and the cell array 200, the read circuit (read driver) 180, the write circuit (write driver) 181 and the like. The peripheral circuit mainly includes planar transistors.

The cell array 200, the core circuit 201, and the peripheral circuit 209 are formed on the same semiconductor substrate. Thus, the core circuit 201 and the peripheral circuit 209 are adjacent to the cell array 200. Incidentally, a plurality of the cell arrays 200 and a plurality of the core circuits 201 may be provided in one semiconductor substrate. In this case, for example, one peripheral circuit (peripheral circuit region) is provided in the semiconductor substrate so as to be made common to the plurality of the cell arrays 200 and the plurality of the core circuits 201.

FIG. 3 is an equivalent circuit diagram showing an example of the internal configuration of the cell array of MRAM and an example of the internal configuration of a circuit used for reading data.

As shown in FIG. 3, the cell array 200 includes a plurality of memory cells MC.

Inside the cell array 200, a plurality of bit lines BL<0>, BL<1>, BL<n>, bBL<0>, bBL<1>, bBL<n> and a plurality of word lines WL<0>, WL<1>, WL<n> are provided. When each of the bit line BL<0>, BL<1>, BL<n> is not to be distinguished below, each bit line is denoted simply as the bit line BL and when each of the bit line bBL<0>, bBL<1>, bBL<n> is not to be distinguished below, each bit line is denoted simply as the bit line bBL. When a plurality word lines WL<0>, WL<1>, WL<n> are not to be distinguished, each word line is denoted simply as the word line WL.

The bit lines BL, bBL extend in the column direction and the word line WL extends in the row direction. The two bit lines BL, bBL form one bit line pair.

The memory cell MC is connected to the bit lines BL, bBL and the word line WL.

A plurality of memory cells MC arranged in the column direction are connected to one bit line pair BL, bBL. A plurality of memory cells MC arranged in the row direction are connected to the common word line WL.

In a hierarchical bit line system, a plurality of bit lines BL<0>, BL<1>, BL<n> are connected to one global bit line GBL via local column switches M1<0>, M1<1>, M1<n> and a plurality of bit lines bBL<0>, bBL<1>, bBL<n> are connected to the other global bit line bGBL via local column switches M2<0>, M2<1>, M2<n>.

On/off of the local column switches M1<0>, M1<1>, M1<n>, M2<0>, M2<1>, M2<n> connected to one of bit lines BL, bBL respectively is controlled by control signals CSL<0>, CSL<1>, CSL<n> respectively.

When each of the local column switches M1<0>, M1<1>, M1<n>, M2<0>, M2<1>, M2<n> is not to be distinguished below, each local column switch is denoted simply as the local column switch M1 or M2.

In a hierarchical word line system, for example, a plurality of word lines WL are connected to the global word line GWL via a sub-word line driver or local row switch (not shown).

FIG. 4 is a view showing an example of the structure of the memory cell MC of an MRAM.

The memory cell MC includes, for example, one magnetoresistive effect element 1 as a memory element and one selection switch 2. The selection switch 2 is a field effect transistor (for example, an n-channel MOS transistor). Hereinafter, a field effect transistor as the selection switch 2 in the memory cell MC will be called a cell transistor (or the selection transistor) 2.

One end of the MTJ element 1 is connected to the bit line BL and the other end of the MTJ element 1 is connected to one end of a current path, a source/drain, of the cell transistor 2. The other end of the current path, a drain/source, of the cell transistor 2 is connected to the bit line bBL. A control terminal (gate) of the cell transistor 2 is connected to the word line WL.

The cell transistor 2 is provided on a semiconductor substrate 41. The cell transistor 2 is, for example, an n-channel MOS transistor.

The cell transistor 2 includes a gate electrode 20 embedded in a recess in the semiconductor substrate 41. A gate dielectric film 21 is provided between the semiconductor substrate 41 and the gate electrode 20. In the present embodiment, a structure in which the electrode of a transistor is embedded in a semiconductor substrate is called an embedded gate structure.

The gate dielectric film 21 is formed on an inner surface of the recess. The gate electrode 20 is formed on the inner surface of the gate dielectric film 21 such that the lower side of the recess is buried. The gate electrode 20 is formed so as to extend in the row direction. The gate electrode 20 is used as the word line WL.

An insulating layer 29 made of, for example, SiN is provided on the gate dielectric film 21 and a top surface of the gate electrode 20 so as to bury an upper side of the recess. The top surface of the insulating layer 29 is approximately as high as the top surface of the semiconductor substrate 41.

Diffusion layers (hereinafter, called source/drain diffusion layers) 23, 24 as a source/drain of the cell transistor 2 are formed in the surface of the semiconductor substrate 41 such that the gate dielectric film 21, the gate electrode 20, and the insulating layer 29 are sandwiched therebetween. The diffusion layers 23, 24 of the cell transistors 2 of two memory cells adjacent along the column direction are shared by two memory cells adjacent in the column direction.

The source/drain diffusion layers 23, 24 of each of the cell transistors 2 are isolated by a device isolation region (device isolation dielectric film) in memory cells arranged in the row direction.

As shown in FIG. 4, contact plugs CP1, CP2 are provided in an interlayer dielectric film (not shown) on the semiconductor substrate 41 so as to be connected to source/drain diffusion layers 23, 24 of the cell transistor 2 respectively.

A magnetoresistive effect element 1 is provided on the contact plug CP1 and the magnetoresistive effect element 1 is connected to the source/drain diffusion layer 23 of the cell transistor 2 via the contact plug CP1. A via plug VP is provided on the magnetoresistive effect element 1 and the magnetoresistive effect element is connected to the bit line BL via the via plug VP. The bit line bBL is connected to the source/drain diffusion layer 24 of the cell transistor 2 via the contact plug CP2. Incidentally, two bit lines BL, bBL forming a bit line pair may be provided at the same wire level.

The structure of a magnetoresistive effect element of the MRAM in the present embodiment will be described using FIGS. 5 and 6.

Figure 6:
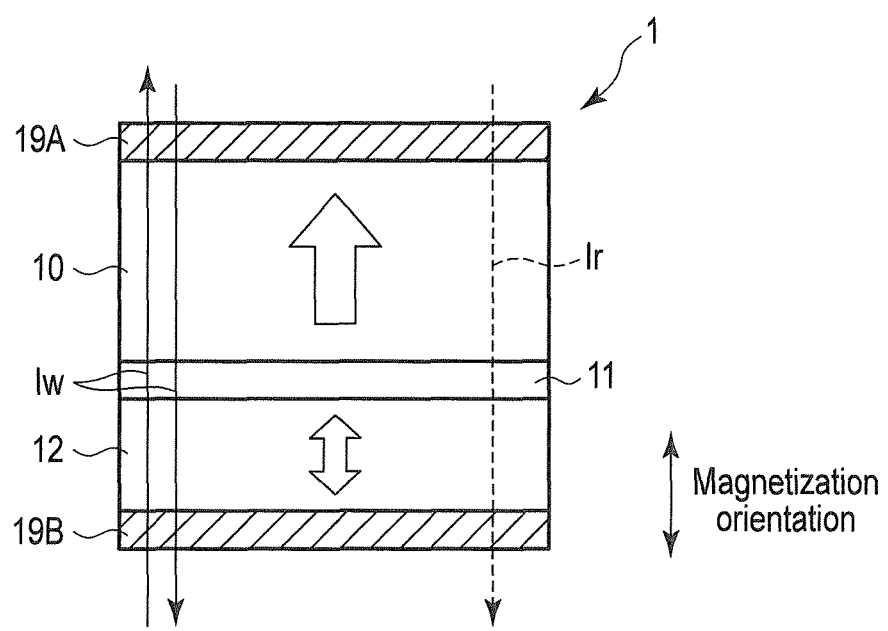
FIG. 6 is a schematic view showing a structure example of the magnetoresistive effect element.

FIGS. 5 and 6 are sectional views schematically showing the structure of a magnetoresistive effect element.

The magnetoresistive effect element used for the memory element 1 is an MTJ element containing a magnetic tunnel junction.

The MTJ element 1 includes a first magnetic layer 10 whose magnetization orientation is invariable (fixed), a second magnetic layer 12 whose magnetization orientation is variable, and a non-magnetic layer 11 between the two magnetic layers 10, 12. A laminated structure including the two magnetic layers 10, 12 and the non-magnetic layer 11 forms a magnetic tunnel junction. The laminated structure 10, 11, 12 forming a magnetic tunnel junction is provided, for example, between two electrodes 19A, 19B.

In the present embodiment, the magnetic layer 10 whose magnetization orientation is invariable is called the reference layer 10 and the magnetic layer 12 whose magnetization orientation is variable is called the storage layer 12. The reference layer 10 is also called a magnetization invariable layer, a pin layer, or a pinned layer. The storage layer 12 is also called a recording layer, a magnetization free layer, or a free layer.

FIG. 5 shows the MTJ element 1 of in-plane magnetization (horizontal magnetization). In the MTJ element 1 of in-plane magnetization, the magnetization orientation of the magnetic layers 10, 12 is parallel to the film surface of the magnetic layers 10, 12. For example, the MTJ element 1 of in-plane magnetization is formed in such a way that the magnetization of the magnetic layers 10, 12 is oriented in a direction parallel to the film surface of the magnetic layers 10, 12 due to shape magnetic anisotropy of a magnetic body. For example, the MTJ element 1 of in-plane magnetization has an elliptic plane shape.

FIG. 6 shows the MTJ element 1 of vertical magnetization. In the MTJ element 1 of vertical magnetization, the magnetization orientation of the magnetic layers 10, 12 is perpendicular to the film surface of the magnetic layers 10, 12. The MTJ element 1 of vertical magnetization is formed in such a way that the magnetization of the magnetic layers 10, 12 is oriented in a direction perpendicular to the film surface of the magnetic layers 10, 12 due to crystal magnetic anisotropy or interface magnetic anisotropy of a magnetic body. For example, the MTJ element of vertical magnetization has a circular plane shape.

When data is written, the magnetization orientation of the storage layer 12 of the MTJ element is changed by the STT method. The magnetization orientation of the storage layer 12 is changed by the action of spin-polarized electrons contained in a current Iw flowing through the element 1 and equal to magnetic reversal threshold or more of the storage layer 12 on magnetization (spin) of the storage layer 12.

"The magnetization orientation of the reference layer 10 is invariable" or "the magnetization orientation of the reference layer 10 is fixed" means that the magnetization orientation of the reference layer 10 does not change when the write current (magnetic reversal current) Iw used to reverse the magnetization orientation of the storage layer 12 flows into the reference layer 10. Thus, in the MTJ element 1, a magnetic layer having a large magnetic reversal threshold is used for the reference layer 10 and a magnetic layer having a smaller magnetic reversal threshold than that of the reference layer 10 is used for the storage layer 12. Accordingly, the MTJ element 1 including the storage layer 12 whose magnetization orientation is variable and the reference layer 10 whose magnetization orientation is invariable is formed.

When the magnetization orientation of the storage layer 12 and the magnetization orientation of the reference layer 10 are made parallel to each other by the STT method, that is, when the magnetization orientation of the storage layer 12 is made the same as the magnetization orientation of the reference layer 10, the current Iw flowing from the storage layer 12 toward the reference layer 10 is supplied to the MTJ element 1. In this case, electrons move from the reference layer 10 toward the storage layer 12 via the tunnel barrier layer 11. The majority of electrons (spin-polarized electrons) of electrons having passed through the reference layer 10 and the tunnel barrier layer 11 have the same orientation as the magnetization (spin) orientation of the reference layer 10. A spin angular momentum (spin torque) of the spin-polarized electrons is applied to the magnetization of the storage layer 12 and the magnetization orientation of the storage layer 12 is reversed to the same orientation as that of the reference layer 10. When magnetization orientations of the two magnetic layers 10, 12 are parallel orientations, the value of resistance of the MTJ element 1 is the smallest. For example, data of "0" is allocated to the MTJ element 1 in which magnetization orientations are parallel orientations.

When the magnetization orientation of the storage layer 12 and the magnetization orientation of the reference layer 10 are made antiparallel, that is, when the magnetization orientation of the storage layer 12 is made opposite to the magnetization orientation of the reference layer 10, the current Iw flowing from the reference layer 10 toward the storage layer 12 is supplied to the MTJ element 1. In this case, electrons move from the storage layer 12 toward the reference layer 10. Electrons having the spin antiparallel to the magnetization orientation of the reference layer 10 are reflected by the reference layer 10. The reflected electrons are injected into the storage layer 12 as spin-polarized electrons. A spin angular momentum of the spin-polarized electrons (reflected electrons) is applied to the magnetization of the storage layer 12 and the magnetization orientation of the storage layer 12 is reversed to the opposite orientation to that of the reference layer 10. When magnetization arrays of the two magnetic layers 10, 12 are antiparallel arrays, the value of resistance of the MTJ element 1 is the largest. For example, data of "1" is allocated to the MTJ element 1 in which magnetization arrays are antiparallel arrays.

In an STT-MRAM, the write circuit 181 includes a source circuit (for example, a current source) to generate the write current Iw and a sink circuit to absorb the write current Iw. When data is written into the STT-MRAM, one of two bit lines forming a bit line pair is connected to the source circuit and the other of the two bit lines is connected to the sink circuit.

When data is read, a read current Ir smaller than the magnetic reversal threshold of the storage layer 12 is supplied into the MTJ element 1. Data stored in the memory cell is read by detecting changes in magnitude of the read current Ir in accordance with the resistance state of the MTJ element.

FIG. 3 shows an example of the circuit configuration of the read circuit 180 used when data is read from the MRAM in the present embodiment.

As shown in FIG. 3, the read circuit 180 is connected to the cell array 200 when data is read. The read circuit 180 includes a sense amplifier 80 and a reference level generator 81. The sense amplifier 80 shown in FIG. 3 is a current detection type sense amplifier. However, the sense amplifier of a read circuit of the MRAM in the present embodiment may be a voltage detection type sense amplifier.

The sense amplifier 80 in FIG. 3 includes a first inverter, a second inverter, n-channel field effect transistors (hereinafter, denoted as n transistors) M4, M5, M6, M7, M8, M9, M15, M16, and p-channel field MOS effect transistors (hereinafter, denoted as p transistors) M17, M18.

The first inverter includes a p transistor M11 and an n transistor M12. The first inverter includes a first input terminal, a first output terminal, and first and second voltage terminals. The second inverter includes a p transistor M13 and an n transistor M14. The second inverter includes a second input terminal, a second output terminal, and third and fourth voltage terminals. The second input terminal is connected to the first output terminal and the second output terminal is connected to the first input terminal.

The drain of the p transistor (sense enable transistor) M17 is connected to the first output terminal of the first inverter and the source of the p transistor M17 is connected to a power supply terminal VDD2A. The drain of the p transistor (sense enable transistor) M18 is connected to the second output terminal of the second inverter and the source of the p transistor M18 is connected to the power supply terminal VDD2A. A sense enable signal SEN1 is supplied from the controller 130 to the gates of the p transistors M17, M18. The sense enable signal SEN1 of an L (low) level is supplied before reading data from the MRAM to turn on the sense enable transistors M17, M18. Nodes SO, SOb are thereby precharged. The sense enable signal SEN1 of an H (high) level is supplied when reading data from the MRAM to turn off the sense enable transistors M17, M18.

The drain of the n transistor M15 is connected to the first voltage terminal (source of the transistor M12) of the first inverter and the source of the n transistor M15 is connected to a ground terminal VSS. The drain of the n transistor M16 is connected to the third voltage terminal (source of the transistor M14) of the second inverter and the source of the n MOS transistor M16 is connected to the ground terminal VSS. A sense enable signal SEN2 is supplied from the controller 130 in FIG. 1 to the gates of the n transistors M15, M16. The sense enable signal SEN2 of the H (high) level is supplied when reading data from the MRAM to turn on the sense enable transistors M15, M16.

The first voltage terminal (source of the transistor M12) of the first inverter is connected to the drain of the n transistor (read enable transistor) M5. The source of the n transistor M5 is connected to the global bit line GBL via the n transistor M4. A read enable signal REN is supplied from the controller 130 to the gate of the n transistor M5. On and off of the n transistor M5 is controlled by the read enable signal REN.

A clamp voltage Vclamp is supplied to the gate of the n transistor (clamp transistor) M4. The clamp voltage Vclamp of the L level is supplied to the gate of the clamp transistor M4 during standby (or before reading data) of the MRAM to turn off (shut off) the clamp transistor M4. When reading data, the clamp voltage Vclamp of a predetermined voltage value (for example, 0.1 to 0.6 V) is supplied to the gate of the clamp transistor M4. Accordingly, the current flowing to the selected cell MC is limited so as not to exceed the upper limit (magnetic reversal threshold of the storage layer) to prevent data stored in the selected cell MC from being destroyed.

The third voltage terminal (source of the transistor M14) of the second inverter is connected to the drain of the n transistor (read enable transistor) M7. The read enable signal REN is supplied from the controller 130 to the gate of the n transistor M7. On and off of the n transistor M7 is controlled by the read enable signal REN.

The source of the n transistor (read enable transistor) M7 is connected to a reference cell RC of the reference level generator 81 via the n transistor (reference transistor) M6. The reference cell RC includes a resistance element 819 of a predetermined value of resistance. Incidentally, the resistance element 819 may be a resistance element made of polysilicon and a diffusion layer or an MTJ element.

The gate of the n transistor M8 is connected to the drain of the n transistor M5 and the first voltage terminal (source of the transistor M12) of the first inverter. The source and drain of the n transistor M8 are connected to the gate of the n transistor (clamp transistor) M4. The clamp voltage Vclamp is supplied to the source and drain of the n transistor M8.

The gate of the n transistor M9 is connected to the drain of the n transistor M7 and the third voltage terminal (source of the transistor M14) of the second inverter. The source and drain of the n transistor M9 are connected to the gate of the n transistor (clamp transistor) M6. A reference potential VREFIx from the reference level generator 81 is supplied to the source and drain of the n transistor M9.

The reference level generator 81 generates a reference level to read data. When data of a memory cell is discriminated by a current detection type sense amplifier, a reference current IREFx to be a reference value to discriminate the data is generated by the reference level generator 81.

The reference potential VREFIx from the reference level generator 81 is supplied to the gate of the n transistor M6 as the reference transistor M6. The reference transistor M6 is driven with a driving force in accordance with the magnitude of the supplied reference potential VREFIx. The reference current IREFx is generated by the reference transistor M6 driven at the reference potential VREFIx and the reference cell RC. Thus, the reference current IREFx of the value of current in accordance with the magnitude of the supplied reference potential VREFIx is generated.

The magnitude of the reference current IREFx is controlled by the resistance element 819 and the reference transistor M6 in the reference cell in such a way that the reference current IREFx is an intermediate value of the read current flowing through a memory cell in which data of "1" is stored (MTJ element of a high resistance state) and the read current flowing through a memory cell in which data of "0" is stored (MTJ element of a low resistance state).

In a current detection type sense amplifier, the clamp transistor M4 functions as a control element on the data input terminal side of the sense amplifier 80 and the reference transistor M6 functions as a control element on the reference terminal side of the sense amplifier.

The bit line (source line) bBL and the global bit line (global source line) bGBL which become the lower potential side when data is read are connected to the ground terminal via the n transistor M3 in a sink circuit. On and off of the n transistor M3 is controlled by a control signal SINK.

When data is read from the MRAM, the read current (cell current) Ir flowing through the selected cell and the reference current IREFx are compared by the sense amplifier 80 and a signal of the H level or L level in accordance with the comparison result of the currents Ir, IREFx is held by a latch circuit formed of the first and second inverters (the p transistors M11, M13 and the n transistors M12, M14).

The signal held by the latch circuit in the sense amplifier 80 is output from the nodes SO, SOb to a subsequent circuit (for example, an ECC circuit or a buffer) as output signals DO, bDO.

For example, to improve the storage density of a memory, reduction of the sizes of a memory cell and an MTJ element in an MRAM, the interval between memory cells, and the interval between MTJ elements is attempted. As a result, there is a possibility of increasing interference between MTJ elements adjacent to each other caused by magnetic fields generated by MTJ elements.

Figure 7:
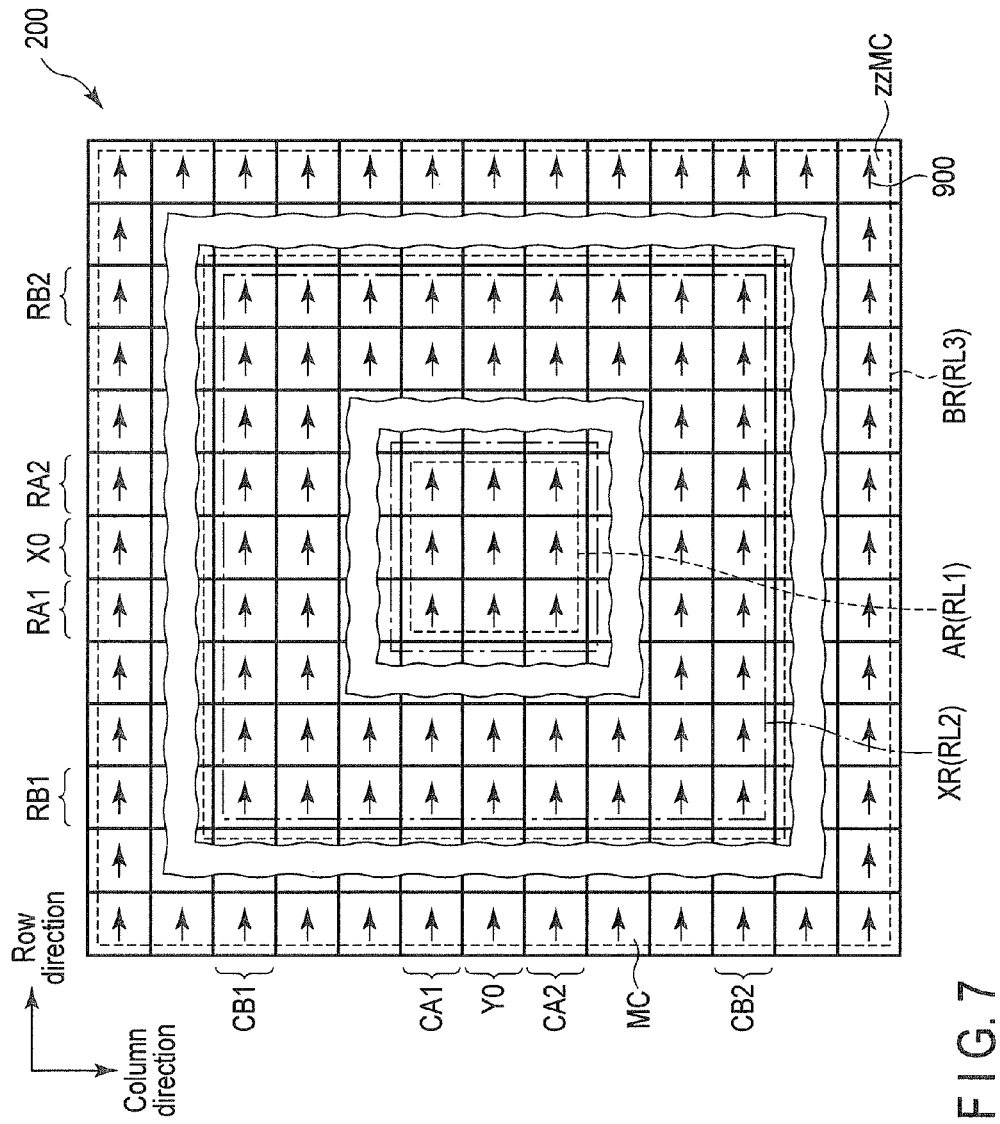
FIG. 7 is a schematic view to describe the magnetic memory in an embodiment.

FIG. 7 is a view schematically showing the magnetization orientation of the reference layer of a magnetoresistive effect element (MTJ element) in a cell array of an MRAM.

In the example shown in FIG. 7, one quadrangle (square) in the cell array 200 corresponds to one memory cell (or one MTJ element). In FIG. 7, an arrow 900 in a quadrangle indicates the magnetization orientation of the reference layer in an MTJ element in each memory cell. FIG. 7 shows the magnetization orientation of the reference layer in the MTJ element of in-plane magnetization.

As shown in FIG. 7, the MTJ element 1 is formed in such a way that magnetization of the reference layer 10 of all the MTJ elements 1 in the cell array 200 is oriented in the same direction by a process (for example, the application of a magnetic field) during a manufacturing process of an MRAM.

As described above, a formation region of a core circuit and a peripheral circuit is provided around the cell array 200.

Figure 8:
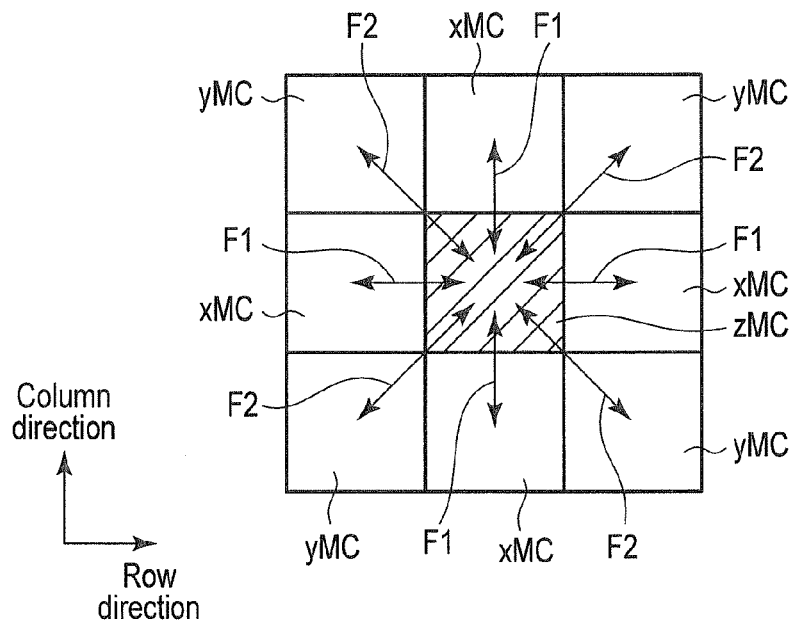
FIG. 8 is a schematic view to describe the magnetic memory in an embodiment.

FIG. 8 is a schematic view illustrating magnetic interference between memory cells (MTJ elements) of an MRAM. To simplify the description, one memory cell (MTJ element) in a cell array is focused on and magnetic interference arising between the memory cell and other cells adjacent to the memory cell will be described.

Eight memory cells are directly adjacent to a certain memory cell zMC. Four memory cells xMC of these eight memory cells are adjacent to the certain memory cell zMC in the row direction or the column direction. The remaining four memory cells yMC of these eight memory cells are adjacent to the certain memory cell zMC in a diagonal direction.

To simplify the description, the plane shape of a memory cell is assumed to be square and the distance between centers of each memory cell is assumed to be the interval between memory cells. In this case, the interval of two memory cells adjacent in the row direction and the interval of two memory cells adjacent in the column direction are denoted as "L1". In addition, the interval of two memory cells adjacent in the diagonal direction is denoted as "L2". If the plane shape of a memory cell is square, the interval L1 and the interval L2 are related by $L2=(\sqrt{2}) \times L1$.

In an MTJ element, the magnetic pole of the storage layer is denoted as "mp1" and the magnetic pole of the reference layer is denoted as "mp2". To simplify the description, the magnitude of the magnetic pole mp1 and the magnitude of the magnetic pole mp2 are assumed to be equal and denoted as a magnetic pole mp.

When, as shown in FIG. 7, magnetization orientations of the reference layer of MTJ elements of eight memory cells adjacent to each other are the same directions, a magnetic force F1 arising between the memory cells zMC and one memory cell xMC adjacent to each other in the column direction (or the row direction) is given by $mp^2/(4\pi\mu \times L1^2)$ based on Coulomb's law. A magnetic force F2 arising between the memory cells zMC and one memory cell xMC adjacent to each other in the diagonal direction is given by $mp^2/(4\pi\mu \times L2^2)$.

When the magnetization orientations of the reference layer of MTJ elements of memory cells adjacent to each other are the same directions, magnetic interference arises between a certain memory cell zMC and eight memory cells xMC, yMC therearound by the magnetic forces F1, F2 between the adjacent memory cells xMC, yMC, zMC. The total of magnetic forces applied to a certain memory cell zMC from the memory cells xMC, yMC therearound is approximately given by 4×F1+4×F2.

If, as described above, the pitches (intervals) L1, L2 between memory cells decrease with a reduced cell size, the magnetic forces F1, F2 arising between memory cells increase. As a result, if the pitch between memory cells decreases to improve the storage density of a memory, the influence of magnetic interference between memory cells increases.

As shown in FIG. 7, a memory cell positioned at an edge (core circuit/peripheral circuit side) in the cell array 200 has a smaller number of memory cells adjacent to the memory cell. For example, a memory cell zzMC positioned at a corner of the cell array 200 is adjacent to one memory cell in the row direction, adjacent to one memory cell in the column direction, and adjacent to one memory cell in the diagonal direction. In the memory cell zzMC at a corner of the cell array 200, the magnitude of magnetic force between the memory cell zzMC and the three adjacent cells is about 2×F1+F2 and magnetic interference in accordance with the magnitude of the magnetic force arises in the memory cell zzMC.

Thus, magnetic interference arising in the memory cell zzMC at a corner of the cell array 200 is smaller than magnetic interference of the memory cell MC positioned in the center of the cell array 200.

Further, a memory cell on the center side of the cell array 200 is surrounded by a plurality of memory cells multiply and thus, the influence of magnetic interference on a memory cell on the center side of the cell array 200 is larger than that on a memory cell on the outer circumferential side of the cell array 200.

As described above, when the magnetization orientations of the reference layer of MTJ elements of memory cells adjacent to each other are the same directions, as shown in FIG. 7, the MTJ element in the memory cells are subject to magnetic fields of MTJ elements in surrounding memory cells. The influence of mutual interference between memory cells manifests itself clearly in memory cells on the center side of the cell array where the number of memory cells arranged in the surrounding area is large. On the other hand, the influence of mutual interference between memory cells is small for memory cells on the outer circumferential (edge) side of the cell array where the number of memory cells arranged in the surrounding area is small.

Even if memory cells and MTJ elements are simultaneously formed by the common process in the same cell array 200, the magnitude of magnetic interference of a memory cell (MTJ element) may be different in accordance with coordinates (address) in the cell array 200 due to magnetic interference between memory cells and apparent characteristics of MTJ elements are different.

The relationship between the position of an MTJ element in the cell array 200 and characteristics of the MTJ element will be described using FIG. 9.

Figure 9:
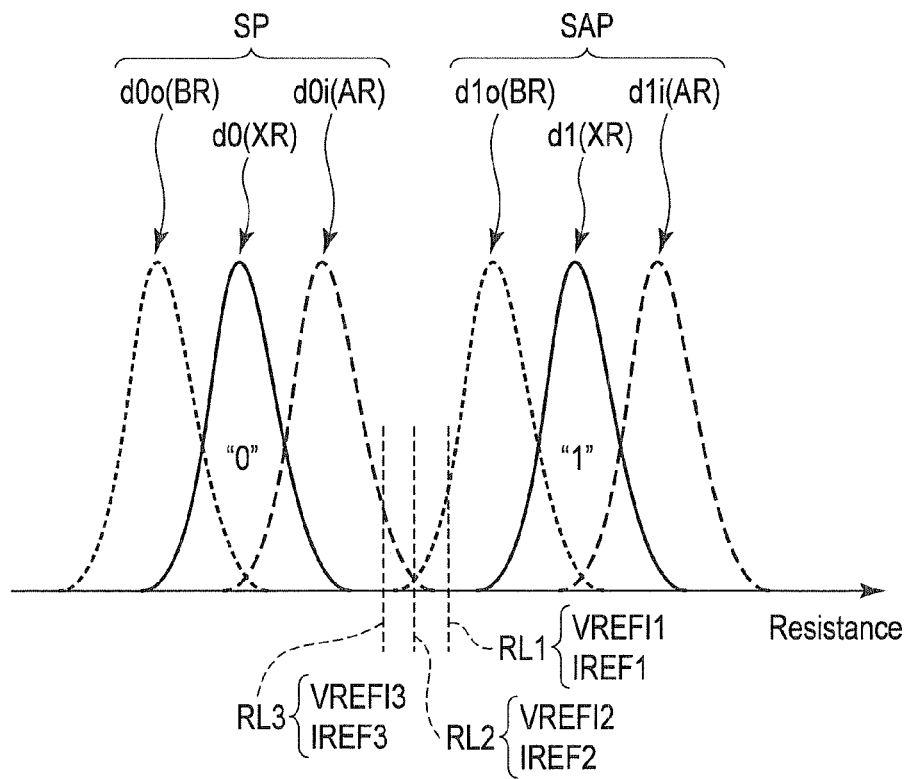
FIG. 9 is a schematic diagram to describe the magnetic memory in an embodiment.

FIG. 9 is a diagram illustrating the relationship between the position of an MTJ element in the cell array and characteristics of the MTJ element.

The horizontal axis of FIG. 9 corresponds to the magnitude of the value of resistance (magnetic resistance) of the MTJ element and the vertical axis of FIG. 9 shows the probability of presence of the MTJ element, number of elements, of a certain resistance in the cell array 200.

As described above, data of "0" is allocated to an MTJ element whose magnetization orientation is a parallel state (low resistance state) SP and data of "1" is allocated to an MTJ element whose magnetization orientation is an antiparallel state (high resistance state) SAP.

Trends of the position in the cell array and characteristics of an MTJ element will be described using an MTJ element between a center portion of the cell array 200 and the outer circumference of the cell array (hereinafter, called an intermediate region or reference region) as a reference.

The value of resistance of an MTJ element positioned on the center side of the cell array is more affected by magnetic interference between MTJ elements than an MTJ element in an intermediate region in the same magnetization orientation state and so may be determined to be larger than the value of resistance of the MTJ element in the intermediate region. On the other hand, the value of resistance of an MTJ element positioned on the outer circumference of the cell array is less affected by magnetic interference between MTJ elements than an MTJ element in an intermediate region in the same magnetization array state and so may be determined to be smaller than the value of resistance of the MTJ element in the intermediate region.

When compared with a distribution d0 of MTJ elements in a data "0" holding state positioned in the intermediate region, a distribution d0o of MTJ elements in the data "0" holding state positioned on the outer circumferential side (core circuit/peripheral circuit side) of the cell array is shifted to the lower resistance side. Also when compared with a distribution d1 of MTJ elements in a data "1" holding state positioned in the intermediate region, a distribution d1o of MTJ elements in the data "1" holding state positioned on the outer circumferential side of the cell array is shifted to the lower resistance side.

In contrast, when compared with the distribution d0 of MTJ elements in the data "0" holding state positioned in the intermediate region, a distribution d0i of MTJ elements in the data "0" holding state positioned on the center side of the cell array is shifted to the higher resistance side. When compared with the distribution d1 of MTJ elements in the data "1" holding state positioned in the intermediate region, a distribution d1i of MTJ elements in the data "1" holding state positioned on the center side of the cell array is shifted to the higher resistance side.

Thus, the value of resistance (apparent value of resistance) of an MTJ element tends to be measured higher than the actual value of resistance of the MTJ element due to magnetic interference between neighboring cells. Incidentally, the value of resistance of an MTJ element on the outer circumferential side of the cell array where the influence of magnetic interference is small is closer to the actual value of resistance of the MTJ element.

Due to magnetic interference between memory cells in the cell array, an end of the distribution d0i of MTJ elements in the data "0" holding state positioned on the center side of the cell array may overlap with an end of the distribution d1o of MTJ elements in the data "1" holding state positioned on the outer circumferential side of the cell array between the distribution d0 of data "0" and the distribution d1 of data "1" of MTJ elements positioned in the intermediate region.

When the read level to determine the resistance state of an MTJ element is set between the distribution d0 of data "0" and the distribution d1 of data "1" of MTJ elements positioned in the intermediate region of the cell array, the data "0" stored in an MTJ element positioned on the center side of the cell array and the data "1" stored in an MTJ element positioned on the outer circumferential side of the cell array may not be determined by the determination level.

Similarly, an error of data determination may occur when an intermediate value of high resistance and low resistance of MTJ elements on the outer circumferential side and the center side of the cell array is used as the determination level common to all memory cells.

As a result, reliability of reading data of an MRAM may be decreased due to magnetic interference between memory cells.

The influence of magnetic interference between memory cells has been described by taking the MTJ element of in-plane magnetization as an example, but such an influence of magnetic interference also occurs in an MTJ element of vertical magnetization.

An MRAM in the present embodiment changes, as shown in FIG. 1, the determination level (read level) RLx (x=1, 2, 3, . . . ) for reading data based on the magnitude of magnetic interference between memory cells in the cell array. For example, the MRAM in the present embodiment selects one determination level from among a plurality of determination levels set to correspond to the magnitude of magnetic interference between memory cells in the cell array based on the magnitude of magnetic interference between memory cells in the cell array and uses the determination level in consideration of the magnitude of magnetic interference to perform a read operation of data from memory cells affected by magnetic interference.

As shown in FIG. 7, in consideration of shifts of the value of resistance of MTJ elements caused by magnetic interference between memory cells, the MRAM in the present embodiment performs a read operation of data of the MRAM by using a plurality of determination levels RL1, RL2, RL3 to read data.

Because, as described by using FIGS. 7 to 9, the magnitude of magnetic interference in the cell array of the MRAM and the position of a memory cell can be associated, the MRAM in the present embodiment selects one determination level from the plurality of determination levels RL1, RL2, RL3 based on an address signal indicating the position of the memory cell from which data should be read and uses the determination level in accordance with coordinates (magnitude of magnetic interference) of the MTJ element in the cell array to read data.

Accordingly, the MRAM in the present embodiment can inhibit a decrease in MRAM reliability due to magnetic interference with MTJ elements.

In the present embodiment, a plurality of regions AR, BR, XR associated with the magnitude of magnetic interference are set in the cell array 200 by considering differences in magnitude of magnetic interference between neighboring cells in the cell array.

In the example shown in FIG. 7, the three regions AR, BR, XR are set. In the present embodiment, a region AR (hereinafter, called a center region AR) near the center of the cell array 200, a region BR (hereinafter, called an outer circumferential region BR) on the edge side (core circuit/peripheral circuit side) of the cell array 200, and a region XR (intermediate region XR) between the region AR near the center of the cell array and the region BR on the edge side are provided in the cell array 200.

The influence of magnetic interference with the MTJ element 1 depends, as described above, on the distance between memory cells (MTJ elements) and the number of memory cells surrounding a certain memory cell. Thus, based on simulations or experimental results, the magnitude of magnetic interference with an MTJ element in the cell array 200 can be associated with coordinates of a memory cell of the cell array.

Each region AR, BR, XR set in the cell array 200 can be identified based on the range indicated by a row address and a column address contained in an address signal.

The median between the first address and the last address of column addresses in the cell array 200 is set as "Y0" and the median between the first address and the last address of row addresses in the cell array 200 is set as "X0". The memory cell indicated by the column address of Y0 and the row address of X0 is a memory cell positioned substantially in the center in the cell array 200.

For example, the intermediate region XR is a region indicated by the range of address values from "CB1" to "CA1" (as a more concrete example, CB1≤CAdd<CA1) and the range of address values from "CA2" to "CB2" (as a more concrete example, CA2<CAdd≤CB2) regarding a column address CAdd and the range of address values from "RB1" to "RA1" (as a more concrete example, RB1≤RAdd<RA1) and the range of address values from "RA2" to "RB2" (as a more concrete example, RA2<RAdd≤RB2) regarding a row address RAdd.

The center region AR on the center side of the cell array from the intermediate region XR is a region indicated by the range of address values from "CA1" to "CA2" (as a more concrete example, CA1≤CAdd≤CA2) regarding the column address CAdd and the range of address values from "RA1" to "RA2" (as a more concrete example, RA1≤RAdd<RA2) regarding the row address RAdd.

The outer circumferential region (peripheral region) BR on the outer side of the cell array from the intermediate region XR is indicated by the range of address values other than column/row addresses indicating the intermediate region XR and the center region AR (as a more concrete example, CAdd<CB1, CB2<CAdd, RAdd<RB1, RB2<RAdd).

In the cell array 200, for example, the intermediate region XR is a ring-shaped region surrounding the center region AR. The outer circumferential region BR is a ring-shaped region surrounding the intermediate region XR in the cell array 200.

These regions AR, BR, XR set in the cell array 200 are not physically separated regions and instead, logical regions (virtual regions) identified by the column address and row address.

Thus, based on the row address and column address indicating the memory cell selected from an external device to read data from, the memory cell of which region of the plurality of regions AR, BR, XR set in the cell array 200 is intended for operation can be discriminated.

An example in which three regions are set in the cell array 200 is shown in the present embodiment, but two regions may be set or four or more regions may be set in accordance with the storage density of the cell array.

In the MRAM in the present embodiment, for example, the reference level generator 81 selects one reference potential VREFIx (x=1, 2, 3) from a plurality of reference potentials VREFI1, VREFI2, VREFI3 based on the supplied address signal to generate the determination levels RL1, RL2, RL3 corresponding to the regions AR, XR, BR, set in the cell array 200 respectively. The reference level generator 81 generates a reference current IREF as the determination levels RL1, RL2, RL3 of each region AR, XR, BR in the cell array 200 based on the selected reference potential VREFI. Hereinafter, when reference potentials VREFI1, VREFI2, VREFI3 are not to be distinguished, the reference potential is simply written as VREFI or VREFIx.

As shown in FIG. 3, the reference level generator 81 of the MRAM in the present embodiment includes, for example, a plurality of voltage terminals into which each reference potential VREFI1, VREFI2, VREFI3 is input, a selection circuit (for example, a selector) 811 to select each reference potential VREFI1, VREFI2, VREFI3, and a control circuit (region determination circuit) 810 to control the operation of the selection circuit.

The control circuit 810 receives an address signal ADR from the controller 130. The control circuit 810 generates a control signal CNT of the selection circuit 811 based on an address signal ADR. The control circuit 810 controls the signal level of the control signal CNT based on calculation processing (for example, comparison of address values) of a column address CAdd and a row address RAdd contained in the address signal ADR.

The reference potentials VREFI1, VREFI2, VREFI3 set so as to correspond to the regions AR, XR, BR set in the cell array 200 are input into input terminals of the selection circuit 811 respectively. For example, the number of reference potentials corresponds to the number of regions set in the cell array.

The control signal CNT from the control circuit 810 is supplied to a control terminal of the selection circuit 811. The selection circuit 811 selects one of a plurality of reference potentials VREFI based on the control signal CNT and supplies the selected reference potential VREFI to a control element of the input terminal on the reference level side of the sense amplifier 80.

If the address signal ADR supplied to the control circuit 810 contains a row address and a column address indicating the intermediate region XR, the control circuit 810 supplies the control signal CNT to the selection circuit 811 such that the reference potential VREFI2 of the intermediate magnitude among the three reference potentials VREFI is supplied to the sense amplifier 80. Based on the control signal CNT from the control circuit 810, the selection circuit 811 selects the reference potential VREFI2 of the intermediate magnitude among the three reference potentials VREFI. The selected reference potential VREFI2 is supplied to the gate of the reference transistor M6 of the sense amplifier 80 as a control voltage of the input terminal on the reference side of the sense amplifier 80.

Accordingly, the reference current IREF2 is generated as the determination level RL2 to discriminate data of a memory cell in the intermediate region XR by the reference transistor M6 to which the reference potential VREFI2 is supplied and the reference cell RC.

As is described using FIG. 9, due to magnetic interference between memory cells (MTJ elements), the value of resistance (apparent value of resistance) of an MTJ element in the center region AR is shifted to a higher level than the value of resistance (apparent value of resistance) of an MTJ element in the intermediate region XR. Thus, the level RL1 higher than the determination level RL2 used for an MTJ element in the intermediate region XR is used as the determination level RL1 of the value of resistance of an MTJ element (memory cell data) in the center region AR.

If the address signal ADR contains a row address and a column address indicating the center region AR, the control circuit 810 supplies the control signal CNT to the selection circuit 811 such that the reference potential VREFI1 larger than the intermediate reference potential VREFI2 among the three reference potentials VREFI is supplied to the sense amplifier 80. Based on the control signal CNT, the selection circuit 811 selects the largest reference potential VREFI1 among the three reference potentials VREFI.

The selected reference potential VREFI1 is supplied to the gate of the reference transistor M6 of the sense amplifier 80 and the reference current IREF1 is generated as the determination level RL1 to discriminate data of a memory cell in the center region AR by the reference transistor M6 to which the reference potential VREFI1 is supplied and the reference cell RC.

In addition, due to magnetic interference between memory cells (MTJ elements), the value of resistance (apparent value of resistance) of an MTJ element in the outer circumferential region BR is shifted to a lower level than the value of resistance of an MTJ element in the intermediate region XR. Thus, a level lower than the determination level RL2 used for an MTJ element in the intermediate region XR is used as the determination level RL3 of the value of resistance of an MTJ element (memory cell data) in the outer circumferential region BR.

If the address signal ADR contains a row address and a column address indicating the outer circumferential region BR, the control circuit 810 supplies the control signal CNT to the selection circuit 811 such that the reference potential VREFI3 smaller than the intermediate reference potential VREFI2 among the three reference potentials VREFI is supplied to the sense amplifier 80. Based on the control signal CNT, the selection circuit 811 selects the smallest reference potential VREFI3 among the three reference potentials VREFI.

The selected reference potential VREFI3 is supplied to the gate of the reference transistor M6 of the sense amplifier 80 and the reference current IREF3 is generated as the determination level RL3 to discriminate data of the memory cell MC in the outer circumferential region BR by the reference transistor M6 to which the reference potential VREFI3 is supplied and the reference cell RC.

In this manner, one reference potential selected from among a plurality of reference potentials VREFI having different magnitudes based on the address signal ADR is supplied as the control voltage on the reference input terminal side of the sense amplifier 80 to the gate (control terminal) of the reference transistor M6 as a control element. The reference transistor M6 is driven based on the magnitude of the selected reference potential VREFI. The reference current IREF of the magnitude corresponding to the magnitude of the reference potential VREFI is generated by the reference cell RC and the reference transistor M6 driven at the reference potential VREFI.

For example, the reference current IREF1 when the reference potential VREFI1 corresponding to the center region AR is used is larger than the reference current IREF2 when the reference potential VREFI2 corresponding to the intermediates region XR is used. The reference current IREF3 when the reference potential VREFI3 corresponding to the outer circumferential region BR is used is smaller than the reference current IREF2 when the reference potential VREFI2 corresponding to the intermediates region XR is used.

In this manner, the reference currents IREF1, IREF2, IREF3 having different magnitudes as the determination levels (read levels) RL in accordance with the regions AR, XR, BR selected based on the address signal ADR are generated respectively.

Incidentally, the discrimination of the address signal ADR by the control circuit 810 in the reference level generator 81 and the selection of the reference potential VREFI by the selection circuit 811 may be performed by the controller 130 in FIG. 1. Each reference potential VREFI may be used as the determination level of reading data of each region in accordance with the circuit configuration of the read circuit 180 and the sense amplifier 80.

In the MRAM in the present embodiment, if the magnitude of magnetic interference between neighboring cells (MTJ elements) in each region AR, XR, BR set in the cell array 200 is different and the value of resistance (apparent value of resistance) of an MTJ element is shifted, the reference current IREFx having the magnitude that is different from position (region) to position (region) in the cell array 200 is used as the determination level RL to read data based on an address signal indicating the position of the selected memory cell in the cell array 200 to discriminate data stored in the selected memory cell MC.

According to the present embodiment, a failure to discriminate data due to magnetic interference between memory cells/MTJ elements can be inhibited by the reference level to be the reference to determine data in accordance with the address of the selected memory cell when data is read being selected/generated.

Therefore, according to a magnetic memory in the present embodiment, reliability of the magnetic memory can be improved.

(b) Operation Example

The operation of a magnetic memory (for example, MRAM) in an embodiment will be described with reference to FIG. 10. Here, FIGS. 1 to 9 are also used when appropriate to describe the operation of the magnetic memory in an embodiment.

FIG. 10 is a flow chart describing the operation of the MRAM in the present embodiment.

Data reading from the MRAM in an embodiment will be described using FIG. 10.

As shown in FIG. 10, data reading from the MRAM in an embodiment is started when a data transfer is requested by an external device (a memory controller or a host device) from the MRAM.

Each circuit in the MRAM is driven based on a command (here, a read command) from the external device. For example, the sense enable signals SEN1, SEN2 and the read enable signal REN are supplied to the sense amplifier 80 in the read circuit 180 shown in FIG. 3 to activate the sense amplifier 80.

The address signal ADR of the memory cell (selected cell) in which data to be read is stored is supplied from the external device to the MRAM (step ST0). The address signal ADR contains the column address CAdd and the row address RAdd indicating the position of the selected cell in the cell array.

The address signal ADR is supplied to from the controller 130 in the MRAM to each decoder 132, 133, 140, 150 and also to the control circuit 810 of the reference level generator 81 in the read circuit 180.

The control circuit 810 determines in which region of a plurality of regions AR, BR, XR set in the cell array 200 the column address CAdd and the row address RAdd contained in the address signal ADR are contained (steps ST1A, ST2A).

For example, as shown in FIG. 7, the center region AR of the cell array 200 is a region indicated by the column address CAdd of address values in the range of "CA1" to "CA2" and the row address RAdd of address values in the range of "RA1" to "RA2".

Whether the column address CAdd of the supplied address signal ADR is "CA1" or more and "CA2" or less and the row address RAdd of the supplied address signal is "RA1" or more and "RA2" or less is determined by the control circuit 810 in the reference level generator 81 (step ST1A).

In step ST1A, if the value of the column address RAdd in the address signal ADR is "CA1" or more and "CA2" or less and the value of the row address CAdd in the address signal ADR is "RA1" or more and "RA2" or less, the control circuit 810 determines that the selected cell indicated by the address signal ADR is present in the center region AR in the cell array 200 (step ST1B).

The control signal CNT based on the determination result of the address (coordinates) of the selected cell in the cell array 200 is supplied from the control circuit 810 to the selection circuit 811. Among a plurality of reference potentials VREFI set to the regions AR, BR, XR in the cell array 200, the reference potential VREFI1 corresponding to the center region AR is selected by the control signal CNT (step ST1C).

Reading of data using the determination level RL1 generated from the selected reference potential VREFI1 is performed from the selected cell in the center region AR (step ST1D).

For example, the selected reference potential VREFI1 is supplied to the gate of the reference transistor M6 as a control voltage of the input terminal on the reference side of the current detection type sense amplifier 80 of the read circuit 180 and the reference transistor M6 is driven by a driving force in accordance with the magnitude of the selected reference potential VREFI1.

The reference current IREF1 as the determination level RL1 for reading data is generated by the reference cell RC and the reference transistor M6 to which the reference potential VREFI1 is supplied.

In parallel with the generation of the reference current IREF1, the bit line BL and the word line WL are activated based on the address signal ADR under the control of the controller 130 and the decoder and the read current Ir is supplied to the selected cell MC in the center region AR indicated by the address signal ADR.

The magnitude of the read current Ir is compared with the magnitude of the reference current IREF1 as the determination level RL1 for the memory cell MC in the center region AR. Whether the data stored in the selected cell is "0" or "1" is thereby discriminated. As a result, data is read from the selected cell in the center region AR.

In step ST1A, if the value of the column address CAdd in the address signal ADR is smaller than "CA1" or larger than "CA2" and/or the value of the row address RAdd in the address signal ADR is smaller than "RA1" or larger than "RA2", the control circuit 810 determines that the selected cell indicated by the address signal ADR is present in a region other than the center region AR in the cell array 200.

When the selected cell is not provided in the center region AR, the control circuit 810 in the reference level generator 81 determines whether the column address CAdd in the address signal ADR is "CB1(<CA1)" or more and "CB2(>CA2)" or less and/or the row address RAdd of the supplied address signal is "RB1(<RA1)" or more and "RB2(>RA2)" or less (step ST2A).

If, in the determination processing of the address signal in step ST2A after step ST1A, the value of the column address CAdd in the address signal ADR is "CB1" or more and "CB2" or less and/or the value of the row address RAdd in the address signal ADR is "RB1" or more and "RB2" or less, the control circuit 810 determines that the selected cell indicated by the address signal ADR is present in the intermediate region XR in the cell array 200 (step ST2B).

The control signal CNT based on the determination result of the address (coordinates) of the selected cell in the cell array 200 is supplied from the control circuit 810 to the selection circuit 811. The selection circuit 811 having received the control signal CNT selects, among the plurality of reference potentials VREFI set to the regions AR, BR, XR in the cell array 200, the reference potential VREFI2 (<VREFI1) corresponding to the intermediate region XR (step ST2C).

Then, reading of data using the reference current IREF2 generated as the determination level RL2 by using the selected reference potential VREFI2 is performed from the selected cell in the intermediate region XR by substantially the same operation as in step ST1D (step ST2D).

The value of resistance (apparent value of resistance) of an MTJ element in the intermediate region XR is more shifted to the lower resistance side than the value of resistance (apparent value of resistance) of an MTJ element in the center region AR. Thus, the reference current IREF2 generated by using the reference potential VREFI2 is smaller than the reference current IREF1 generated by using the reference potential VREFI1.

If, in the determination processing of the address signal ADR in steps ST1A, ST2A, the selected cell is determined not to be present in the center region AR or the intermediate region XR, the control circuit 810 in the reference level generator 81 determines that the selected cell is present in the outer circumferential region BR in the cell array 200 (step ST3A).

The selection circuit 811 having received the control signal CNT corresponding to the outer circumferential region BR selects, among the plurality of reference potentials VREFI, the reference potential VREFI3(<VREFI2) corresponding to the outer circumferential region BR (step ST3B).

Then, reading of data using the reference current IREF3 as the determination level RL3 generated by using the selected reference potential VREFI3 is performed from the selected cell in the outer circumferential region BR by substantially the same operation as in step ST1D or ST2D (step ST3C).

The value of resistance (apparent value of resistance) of an MTJ element in the outer circumferential region BR is more shifted to the lower resistance side than the value of resistance (apparent value of resistance) of an MTJ element in the center region AR or the intermediate region XR. Thus, the reference current IREF3 generated by using the reference potential VREFI3 is smaller than the reference current IREF2 generated by using the reference potential VREFI2.

Data read from a memory cell using the determination level (here, the reference current IREF) in accordance with each region AR, XR, BR in the cell array 200 by the above operation undergoes predetermined processing such as ECC processing before being transferred from the MRAM to an external device.

In the example shown in FIG. 10, coordinates in the cell array of the selected cell indicated by an address signal are determined from an external device in the order of the center region AR, the intermediate region XR, and the outer circumferential region BR, but the present embodiment is not limited to such an example. For example, coordinates in the cell array of the selected cell may be determined based on an address signal in the order of the outer circumferential region BR, the intermediate region XR, and the center region AR.

Reading of data from an MRAM in an embodiment is performed as described above.

Writing of data into an MRAM in the present embodiment is performed by writing of data using STT. That is, a memory cell indicated by an address signal from outside is activated, one bit line of two bit lines of a bit line pair is set to the high potential side in accordance with data to be written, and the remaining bit line is set to the low potential side. The write current Iw flowing in a direction in accordance with data to be written is supplied into the MTJ element 1 in the selected cell to write data by magnetic reversal of the storage layer.

As described using FIG. 10, when data is read from the MRAM in the present embodiment, one determination level is selected from a plurality of determination levels RL (for example, the reference currents IREF) by considering the influence of magnetic interference between memory cells, for example, shifting of the value of resistance of MTJ elements, to perform reading of data from the MRAM.

Because the magnitude of magnetic interference in the cell array of the MRAM and the position of a memory cell can be associated, when data is read from the MRAM in the present embodiment, one determination level is selected from the plurality of determination levels RL1, RL2, RL3 based on an address signal indicating the position of the memory cell from which data is to be read.

Accordingly, reading of data using the determination level in consideration of the influence of magnetic interference between memory cells/MTJ elements (the magnitude of magnetic interference and differences of magnetic interference from region to region) is performed.

According to the present embodiment, therefore, reading of data is performed from a memory cell affected by magnetic interference with high precision using the determination level in consideration of magnetic interference in the cell array by the reference level to be the reference to determine data in accordance with the address of the memory cell selected when data is read being selected/generated and a failure to discriminate data due to magnetic interference between memory cells/MTJ elements can be inhibited.

Therefore, according to a magnetic memory in the present embodiment, reliability of the magnetic memory can be improved.

(c) Modification

A modification of a magnetic memory (for example, MRAM) in the present embodiment will be described with reference to FIG. 11.

In an MRAM in an embodiment, a region in the cell array 200 set by considering mutual interference of magnetic fields between memory cells is set by the range shown by both of the row address and the column address. Then, in an MRAM in an embodiment, one determination level used to read data is selected from a plurality of determination levels (for example, reference currents) based on the row address and column address contained in the address signal ADR supplied from outside.

However, a plurality of regions may be set in a cell array using one of the row address and column address of the cell array to set a determination level (a reference potential and a reference current) in consideration of the magnitude of magnetic interference in each region (difference of magnetic interference from region to region) to each region.

Figure 11:
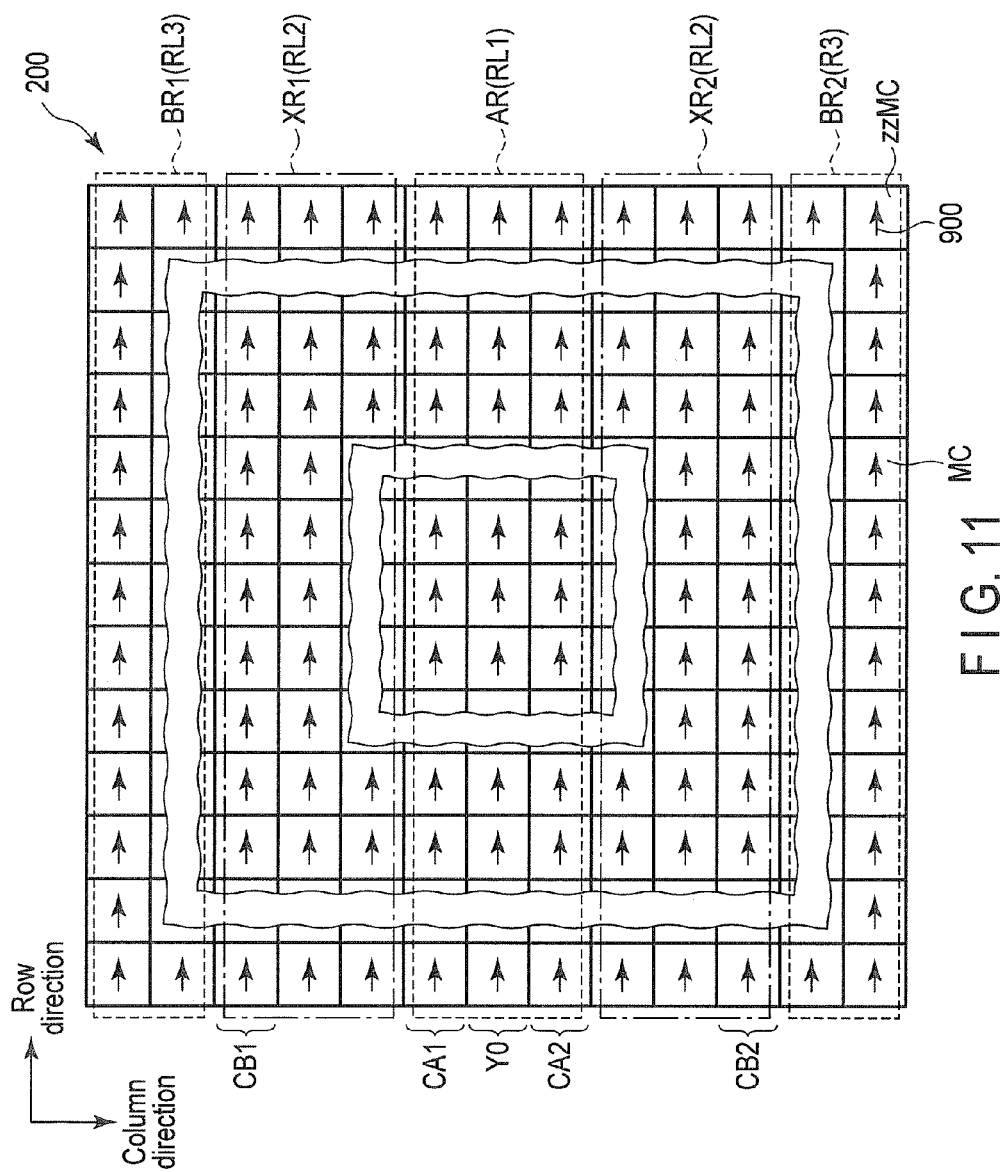
FIG. 11 is a view to describe a modification of the magnetic memory in an embodiment.

FIG. 11 is a schematic view illustrating a modification of an MRAM in the present embodiment.

If, for example, the storage density of a cell array is low and the number of memory cells in the cell array is small, as shown in FIG. 11, only the column address contained in an address signal may be used to set a region in the cell array 200 associated with the magnitude of magnetic interference.

If, for example, the address value of the column address CAdd is in the range of "CA1≤CAdd≤CA2", a first region (center region) AR is set in the cell array 200. For example, the determination level RL1 (reference current IREF1) in FIG. 7 is set as the determination level for reading data from a memory cell in the center region.

If the address value of the column address CAdd is in the range of "CB1>CAdd" and/or "CAdd>CB2", second regions (outer circumferential regions) $BR_1$, $BR_2$ are set in the cell array 200. The determination level RL3 (reference current IREF3) in FIG. 7 is set as the determination level for reading data from a memory cell in the outer circumferential regions $BR_1$, $BR_2$. The reference current IREF3 as the determination level RL3 is smaller than the reference current IREF1 as the determination level RL1.

If the address value of the column address CAdd is in the range of "CB1≤CAdd<CA1" and/or "CA2<CAdd≤CB2", third regions (intermediate regions) $XR_1$, $XR_2$ are set. The determination level RL2 (reference current IREF2) in FIG. 7 is set as the determination level for reading data from a memory cell in the intermediate regions $XR_1$, $XR_2$. The reference current IREF2 as the determination level RL2 is smaller than the reference current IREF1 as the determination level RL1 and larger than the reference current IREF3 as the determination level RL3.

In this manner, a plurality of regions (logical regions) AR, $BR_1$, $BR_2$, $XR_1$, $XR_2$ divided in the column direction are set in the cell array 200. In addition, the determination levels RL1, RL2, RL3 in consideration of the magnitude of magnetic interference between memory cells/MTJ elements are set to the regions AR, $BR_1$, $BR_2$, $XR_1$, $XR_2$.

Here, an example in which regions in the cell array are set based on only the column address and a reference current as a determination level is generated based on the column address is described, but a similar operation can also be performed when each region in the cell array is set and identified only by the row address.

Thus, even if each region in a cell array is set based on one of the row address and the column address of the cell array and the determination level (reference potential/reference current) in consideration of the magnitude of magnetic interference for a memory cell (MTJ element) is selected, like an MRAM described using FIGS. 1 to 10, a failure to discriminate data due to mutual interference of magnetic fields between memory cells can be inhibited.

Therefore, according to a magnetic memory in the present embodiment, reliability of the magnetic memory can be improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic memory comprising:
a cell array including a plurality of memory cells arranged along first and second directions, the cell array including a first region and a second region around the first region, and each memory cell including a magnetoresistive effect element as a memory element; and
a read circuit to read data from a memory cell selected based on an address signal from among the memory cells,
wherein the read circuit selects one determination level from among a plurality of determination levels based on a region, from among the first and second regions, in which the selected memory cell is located, and uses the selected determination level to perform reading of the data from the selected memory cell.

2. The magnetic memory according to claim 1, wherein:
each of the magnetoresistive effect elements includes a first magnetic layer in which an orientation of magnetization is invariable, a second magnetic layer in which an orientation of magnetization is variable, and a non-magnetic layer between the first and second magnetic layers; and
the magnetization of the first magnetic layers of the magnetoresistive effect elements is oriented toward a first side of the cell array.

3. The magnetic memory according to claim 1, wherein magnetic interference for a memory cell in the first region is larger than magnetic interference for a memory cell in the second region.

4. The magnetic memory according to claim 1, wherein a value of resistance of a magnetoresistive effect element in a first magnetization orientation state in the first region is larger than a value of resistance of a magnetoresistive effect element in the first magnetization orientation state in the second region.

5. The magnetic memory according to claim 1, wherein a position of a magnetoresistive effect element in the cell array is associated with the address signal.

6. A magnetic memory comprising:
a cell array including a plurality of memory cells arranged along first and second directions, the cell array including a first region, a second region around the first region, and a third region around the first region and between the first region and the second region, each memory cell including a magnetoresistive effect element as a memory element; and
a read circuit to read data from a memory cell selected based on an address signal from among the memory cells, wherein the read circuit generates a first determination level to determine data stored in a memory cell in the first region, a second determination level to determine data stored in a memory cell in the second region, and a third determination level to determine data stored in a memory cell in the third region, the first determination level is larger than the third determination level, the second determination level is smaller than the third determination level, and the read circuit selects one of the first to third determination levels based on the address signal and uses the selected determination level to perform reading of the data from the selected memory cell.

7. The magnetic memory according to claim 6, wherein:
the address signal includes a first address value indicating a position of a memory cell in the first direction of the cell array and a second address value indicating the position of the memory cell in the second direction of the cell array; and
the read circuit selects one of the first to third determination levels based on the first address value and the second address value.

8. The magnetic memory according to claim 6, wherein:
the address signal includes a first address value indicating a position of a memory cell in the first direction of the cell array and a second address value indicating the position of the memory cell in the second direction of the cell array; and
the read circuit selects one of the first to third determination levels based on the first address value.

9. The magnetic memory according to claim 6, wherein:
each of the magnetoresistive effect elements includes a first magnetic layer in which an orientation of magnetization is invariable, a second magnetic layer in which an orientation of magnetization is variable, and a non-magnetic layer between the first and second magnetic layers; and the magnetization of the first magnetic layers of the magnetoresistive effect elements is oriented toward a first side of the cell array.

10. The magnetic memory according to claim 6, wherein:
each of the memory cells in the cell array includes magnetic interference caused by magnetization of a magnetic layer included in the magnetoresistive effect element; and the magnetic interference for a memory cell in the first region is larger than the magnetic interference for a memory cell in the second region.

11. The magnetic memory according to claim 6, wherein a value of resistance of a magnetoresistive effect element in a first magnetization orientation state in the first region is larger than a value of resistance of a magnetoresistive effect element in the first magnetization orientation state in the second region.

12. The magnetic memory according to claim 6, wherein the read circuit includes:
a control circuit to which the address signal is supplied and which generates a control signal based on the address signal; and
a selection circuit that selects one of the first to third determination levels based on the control signal.

13. The magnetic memory according to claim 6, wherein:
the read circuit includes a reference level generator and a sense amplifier,
the reference level generator includes:
a control circuit to which the address signal is supplied and which generates a control signal based on the address signal; and
a selection circuit to which a first potential to generate the first determination level, a second potential to generate the second determination level, and a third potential to generate the third determination level are supplied and which selects one of the first to third determination levels based on the control signal,
the sense amplifier includes:
a first input terminal to which a read current flowing through the memory cell selected by the address signal is supplied; and
a second input terminal to which a reference current generated by using the potential selected by the selection circuit is supplied as the selected determination level, and
the sense amplifier outputs a comparison result of the read current and the reference current as the data of the selected memory cell.

14. A controlling method of a magnetic memory, the method comprising:
supplying, to a control circuit, an address signal indicating a memory cell in a cell array from which data is to be read, the cell array including a plurality of memory cells arranged along first and second directions, the cell array including a first region and a second region around the first region, and each memory cell including a magnetoresistive effect element as a memory element;

selecting, by the control circuit, one determination level from among a plurality of determination levels based on a region, from among the first and second regions, in which the memory cell indicated by the address signal is located; and reading, by the control circuit, the data from the memory cell indicated by the address signal using the selected determination level.

15. The method according to claim 14, wherein:
each of the magnetoresistive effect elements includes a first magnetic layer in which an orientation of magnetization is invariable, a second magnetic layer in which an orientation of magnetization is variable, and a non-magnetic layer between the first and second magnetic layers; and the magnetization of the first magnetic layers of the magnetoresistive effect elements is oriented toward a first side of the cell array.

16. The method according to claim 14, wherein magnetic interference for a memory cell in the first region is larger than magnetic interference for a memory cell in the second region.

17. The method according to claim 14, wherein a value of resistance of a magnetoresistive effect element in a first magnetization orientation state in the first region is larger than a value of resistance of the magnetoresistive effect element in the first magnetization orientation state in the second region.

18. The method according to claim 14, wherein:
the cell array further includes a third region around the first region and between the first region and the second region,
the determination levels include:
a first determination level to determine data of a memory cell in the first region;
a second determination level to determine data of a memory cell in the second region; and
a third determination level to determine data of a memory cell in the third region,
the first determination level is higher than the third determination level, and
the second determination level is lower than the third determination level.

19. The method according to claim 14, wherein:
the address signal includes a first address value indicating a position of a memory cell in the first direction of the cell array and a second address value indicating the position of the memory cell in the second direction of the cell array; and
one of the determination levels is selected based on the first address value and the second address value.

20. The method according to claim 14, wherein:
the address signal includes a first address value indicating a position of a memory cell in the first direction of the cell array and a second address value indicating the position of the memory cell in the second direction of the cell array; and
one of the determination levels is selected based on the first address value.

* * * * *